United States Patent
Thomas et al.

(10) Patent No.: US 7,320,931 B2
(45) Date of Patent: Jan. 22, 2008

(54) INTERFACIAL LAYER FOR USE WITH HIGH K DIELECTRIC MATERIALS

(75) Inventors: Shawn G. Thomas, Gilbert, AZ (US); Vida Ilderem, Phoenix, AZ (US); Papu D. Maniar, Mesa, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 10/903,841

(22) Filed: Jul. 30, 2004

(65) Prior Publication Data

US 2006/0022283 A1    Feb. 2, 2006

(51) Int. Cl.
    *H01L 29/72*    (2006.01)
(52) U.S. Cl. .................. 438/503; 438/471; 438/478; 438/585; 257/310; 257/407; 257/410; 257/532; 257/616
(58) Field of Classification Search ................ 257/410, 257/532, 616, 310, 407; 438/478, 471, 503, 438/585
    See application file for complete search history.

(56) References Cited

U.S. PATENT DOCUMENTS

| | | |
|---|---|---|
| 6,184,072 B1 | 2/2001 | Kaushik et al. |
| 6,537,370 B1 * | 3/2003 | Hernandez et al. .......... 117/88 |
| 6,617,639 B1 | 9/2003 | Wang et al. |
| 6,620,713 B2 | 9/2003 | Arghavani et al. |
| 6,621,114 B1 | 9/2003 | Kim et al. |
| 6,723,621 B1 * | 4/2004 | Cardone et al. ............. 438/478 |
| 2003/0071281 A1 * | 4/2003 | Lippert et al. ............... 257/200 |
| 2003/0111678 A1 | 6/2003 | Colombo et al. |
| 2003/0116804 A1 | 6/2003 | Visokay et al. |
| 2004/0005740 A1 | 1/2004 | Lochtefeld et al. |
| 2005/0218453 A1 * | 10/2005 | Langdo et al. ............... 257/352 |

OTHER PUBLICATIONS

Huang et al.; "$La_2O_3/Si_{0.3}Ge_{0.7\ p}$-MOSFETs With High Hold Mobility and Good Device Characteristics"; *IEEE Electron Device Letters*, vol. 23, No. 12, Dec. 2002; pp. 710-712; Taiwan.
Pal et al.; "$Ga_2O_3$ ($Gd_2O_3$) Film as High-K Gate Dielectric for SiGe MOSFET Devices";*Electronics Letters*, vol. 36, No. 24, Nov. 2000; pp. 2044-2046; USA.
Morisaki et al.; Ultra-thin ($T_{eff}^{inv}$=1.7nm) Poly-Si-gated SiN/$HfO_2$/SiON High-k Stack Dielectrics with High Thermal Stability (1050° C.); *IEEE* 2002; pp. 861-864; Japan.

(Continued)

*Primary Examiner*—Edward Wojciechowicz
(74) *Attorney, Agent, or Firm*—Ingrassia Fisher & Lorenz P.C.

(57) ABSTRACT

Methods and apparatus are provided for depositing a layer of pure germanium can on a silicon substrate. This germanium layer is very thin, on the order of about 14 Å, and is less than the critical thickness for pure germanium on silicon. The germanium layer serves as an intermediate layer between the silicon substrate and the high k gate layer, which is deposited on the germanium layer. The germanium layer helps to avoid the development of an oxide interfacial layer during the application of the high k material. Application of the germanium intermediate layer in a semiconductor structure results in a high k gate functionality without the drawbacks of series capacitance due to oxide impurities. The germanium layer further improves mobility.

18 Claims, 2 Drawing Sheets

OTHER PUBLICATIONS

Tavel et al.; "High performance 40 nm nMOSFETs with HfO$_2$ Gate Dielectric and Polysilicon Damascene Gate"; *IEEE* 2002; pp. 429-432; France.

Fan et al.; "Impact of Interfacial Layer and Transition Region on Gate Current Performance for High-K Gate Dielectric Stack: Its Tradeoff with Gate Capacitance"; *IEEE Transactions on Electron Devices*, vol. 50, No. 2, Feb. 2003; pp. 433-439; USA.

Gang Bai; "High K Gate Stack for Sub 0.1 UM CMOS Technology"; *Electrochemical Society Proceedings*, vol. 99-10; pp. 39-44; USA.

* cited by examiner

INTERFACIAL LAYER FOR USE WITH HIGH K DIELECTRIC MATERIALS

FIELD OF THE INVENTION

The present invention generally relates to semiconductor devices and methods for their manufacture, and more particularly relates to the use of an interfacial germanium layer for use with high k dielectric materials and silicon substrates.

BACKGROUND OF THE INVENTION

Field Effect Transistors (FETs) have found a wide application in the electronics industry. Some specific processing applications include switching, amplification, filtering, and other tasks. Metal Oxide Field Effect Transistors (MOSFETs) are one of the more common type of FET devices now used. They find significant use, for example, in digital processing applications. A MOSFET structure typically includes a metal or polysilicon gate contact energized to create an electric field within a semiconductor channel, which allows current to conduct between source and drain regions.

Designers, following Moore's law, continue in their attempts to shrink the size of transistors. As transistors become smaller and smaller, gate dielectric layers have also become thinner and thinner. The continued decrease in the thickness of gate dielectric layers is leading to technical problems. Leakage through a silicon dioxide dielectric layer of a gate increases exponentially as its thickness decreases. Gate dimensions that are proposed for the future will require dielectric layers that are so thin they may stray from purely "on" and "off" states. Instead, leakage may lead to a low power, or "leaky", off state. This challenge must be addressed for the success of future transistor generations.

One alternative that is being proposed is to use high k materials in place of silicon dioxide as the gate dielectric layer. High k refers to a high dielectric constant, a measure of how much charge a material can hold. Differing materials possess differing abilities to hold charge. High k materials include compounds of oxygen such as hafnium dioxide ($HfO_2$), zirconium dioxide ($ZrO_2$), and titanium dioxide ($TiO_2$), and possess a dielectric constant above 3.9, the value of silicon dioxide.

The dielectric constant also affects transistor performance. As k value increases, the transistor capacitance also increases. This increased capacitance allows the transistor to switch properly between the "on" and "off" states. Further, the higher k values correspond to a high quality switching such that there is very little current leakage in the "off" state and high current flow during the "on" state. Additionally, high k materials in the dielectric stack can lead to improved charge mobility in the final transistor. The good charge mobility that is characteristic of high k materials can improve the performance, reliability, and lifespan of the transistor. Thus high k materials hold significant promise as a potential material to be used in dielectric stacks.

However, the electronic industry has predominantly used silicon dioxide as a material for the dielectric layer for the last several decades. Experimental use of high k materials for the dielectric layer is now revealing other manufacturing and processing challenges that were not apparent when thicker silicon dioxide layers were employed. It is desired to overcome these technical challenges in order to further develop applications of high k materials. One particular problem that is manifested when high k materials are used in the dielectric layer is poor dielectric performance due to the formation of oxides at the surface of the silicon layer.

Many of the materials being proposed for use in the high k dielectric layer are compounds that include oxygen. Further the deposition of these materials on a silicon substrate may include processing steps that include an oxidizing step. Chemical Vapor Deposition (CVD) or sputtering of one element followed by the oxidation of the material is one exemplary kind of process for forming a high k dielectric layer. Oxygen, whether as an ambient gas that is present in the deposition process or supplied in the oxide compound itself, is thus present in close proximity to the silicon substrate. The result of this kind of manufacturing is that an interfacial layer, a layer between the silicon substrate and the high k dielectric layer, is appearing. The interfacial layer includes oxide materials such as silicon dioxide that result from oxygen reactions with the silicon of the substrate. And these oxide materials hurt the performance otherwise to be achieved with high k dielectric materials.

A thin silicon dioxide layer is in effect a low k interfacial layer. This kind of low k interfacial layer acts electronically like a capacitor in series with the high k dielectric layer. The effect of the silicon dioxide interfacial layer is to decrease the overall capacitance of the gate dielectric stack, thus defeating the advantage of using high k materials. Additionally, the interfacial layer leads to mobility degradation in the channel region (just below the gate dielectric layer), and thus degrades the performance of the device it is associated with.

Accordingly, it is desirable to identify new materials and methods of applying these materials in high k dielectric layers. The desired process and materials should reduce or eliminate the interfacial oxide layer effect noted in previous use with high k materials in gate dielectric layers. In addition, it is desirable to develop these materials and methods so that they are suitable for use with current processing techniques used in FET fabrication. It is also desired to apply high k dielectric materials so as to improve charge mobility in the semiconductor and thus to improve the semiconductor's useful lifespan. The present invention addresses one or more of these needs. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, whenever possible like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

It has now been discovered that a layer of pure germanium can be grown on a silicon substrate. This germanium layer is very thin, on the order of about 14 Å, and is less than the critical thickness for pure epitaxial germanium on silicon. The germanium layer serves as an intermediate layer between the silicon substrate and the high k gate layer. The germanium layer helps to avoid the development of an oxide interfacial layer during the application of the high k material. Application of the germanium intermediate layer results in a high k gate functionality without the drawbacks of series capacitance due to oxide impurities.

Figure 1:
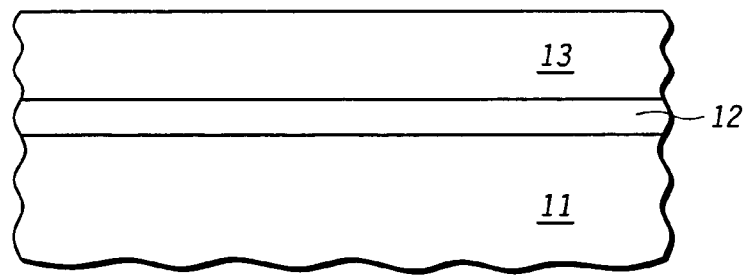
FIG. 1 is a perspective view of a semiconductor structure using a germanium interfacial layer according to an embodiment of the present invention.

Referring now to FIG. 1 there is shown a schematic diagram of a semiconductor structure using the germanium layer according to an embodiment of the present invention. It will be understood by those skilled in the art that the semiconductor structure shown in FIG. 1 may be subjected to processing so as to transform the transistor structure from the multilayer structure of FIG. 1 into the finished transistor shown in FIG. 2. As shown in FIG. 1, the structure comprises a silicon base layer 11, a thin germanium layer 12, and a dielectric layer 13 of high k materials. Silicon layer 11 is a silicon substrate as used in the manufacture of silicon-based semiconductors. Alternatively silicon layer 11 may comprise a silicon-on-insulator material (SOI).

In an alternative embodiment, layer 11 may comprise a material other than silicon. The optional materials comprise gallium-arsenide (GaAs), indium-phosphide (InP), any alloy compound of GaAs, and any alloy compound of InP.

Figure 2:
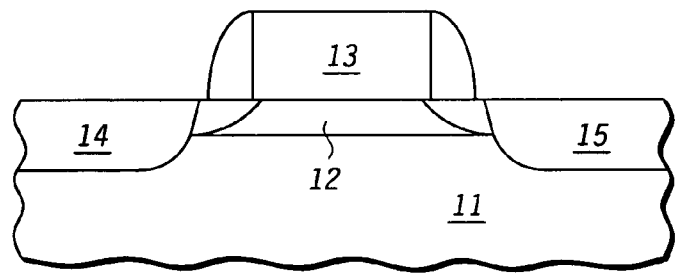
FIG. 2 is a perspective view of a transistor structure that may developed with processing steps according to an embodiment of the present invention.

Referring now to FIG. 2 there is shown a representative example of a finished transistor. This transistor may be fashioned from the starting structure of FIG. 1. In addition to silicon base layer 11, germanium layer 12, and dielectric layer 13, the finished transistor further comprises a source area 14 and a drain area 15. In addition the physical geometry of the dielectric stack has been shaped so as to transform the dielectric layer 13 into a gate. Those skilled in the art will understand this is part of the manufacturing process to transform a semiconductor stack into a finished transistor.

The method of developing the semiconductor structure shown in FIG. 1 begins with the preparation of a silicon substrate 11. This can be achieved through any of the known procedures used in the semiconductor art. For example, the substrate may be a bulk silicon substrate. Alternatively, the semiconductor substrate may be a silicon-on-insulator type substrate. The substrate may also include dopants such as p-doping. The development of the substrate 11 will render an exposed surface of the substrate onto which further layers of material, in this case, the germanium layer 12 will be deposited. In a preferred embodiment, the exposed silicon surface is a single crystal material that is substantially free of surface oxides. It is also thus preferred that silicon layer 11 comprise single crystal silicon material.

In addition to the steps to create the silicon substrate 11, the substrate 11 may additionally receive an optional treatment to remove or diminish oxides on the exposed surface. A cleaning procedure includes cleaning the exposed surface with a solution of hydrofluoric acid, as well as other cleaning procedures used in the semiconductor industry. The cleaning procedure may follow in situ or ex situ cleaning methods known in the art. It is additionally preferred that the silicon material be substantially free of contaminants, and especially at the exposed surface. As is known in the art, the processing of the silicon substrate 11 may take place in vacuum or under an inert atmosphere in order to minimize the presence of oxygen.

In a next step, a layer of germanium 12 is deposited on the exposed surface of the silicon layer. In completing this step, the germanium layer 12 covers what was previously the exposed silicon surface, or a portion of the exposed surface. Upon completion of the germanium layer 12 it now has an exposed surface. Later materials, such as the high k material may be deposited on that surface.

In one embodiment the germanium layer 12 is preferably high purity germanium. In this embodiment impurities or other materials in the germanium are avoided. This is preferred where the thickness of the germanium layer is below the critical thickness. Alternatively germanium layer 12 can include small amounts of carbon.

Methods to deposit the germanium layer on the silicon include molecular beam epitaxy (MBE) and chemical vapor deposition (CVD). MBE is a method that allows close control of material growth at an atomic scale. MBE further allows deposition of thin epitaxial layers with excellent control, repeatability, and throughput. Thus MBE is well suited to the deposition of a thin germanium layer. Molecular beam epitaxy employs solid-source evaporation in an ultra-high vacuum environment; materials may typically be individually controlled by feed systems such as pneumatic shutters. The process provides flexibility and allows intricate alloy and superlattice structures to be fabricated under computer control with a high degree of repeatability.

In one embodiment of the MBE deposition method, a silicon wafer is first placed in an MBE chamber. A germanium source is loaded into one or more effusion cells. Each effusion cell may be heated to a desired level to promote mass transfer of germanium. The MBE chamber is preferably evacuated to provide a high level of vacuum. The silicon wafer is heated to a desired temperature to promote epitaxial growth of germanium on the wafer. A shutter in the MBE apparatus is opened to expose the germanium to the MBE chamber for a desired length of time. Other controls common to MBE deposition, such as rotation of the silicon wafer, may also be included in the system. Control parameters such as time, temperature, and energy transfer are selected so as to promote epitaxial, 2-dimensional growth of the germanium on the silicon substrate.

Other optional deposition procedures may also be used to form the germanium layer. These methods include metal organic chemical vapor deposition (MOCVD), atomic layer deposition (ALD), atomic vapor deposition (AVD), physical vapor deposition (PVD), chemical solution deposition (CSD), pulsed laser deposition (PLD), or the like.

Figure 3:
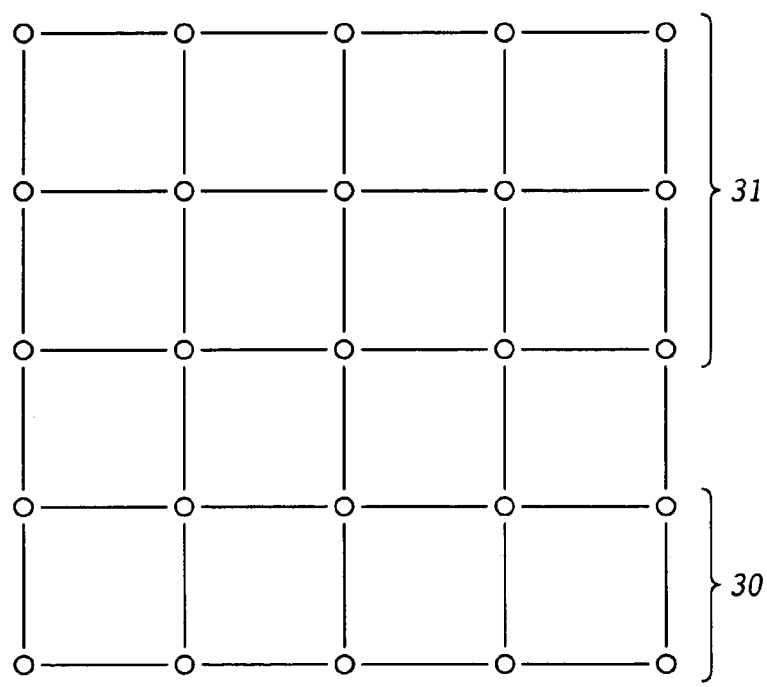
FIG. 3 is a perspective view of the lattice structures of germanium crystal and silicon crystal according to an embodiment of the present invention.

Referring now to FIG. 3 there is shown a diagram of a crystal lattice of germanium matched with a silicon crystal. The silicon portion of the crystal is shown as layer 30, and the germanium portion is layer 31. The lattice structures of germanium and silicon, by themselves, are mismatched in that the space between germanium atoms in a pure germanium crystal is larger than the space between silicon atoms in a pure silicon crystal. However, below a certain thickness, a germanium crystal layer can be epitaxially grown on a silicon crystal layer. The germanium atoms in the germanium lattice structure, at a thickness below the critical thickness, can adapt to match the lattice structure of silicon. The germanium lattice stretches or squeezes to match silicon on the horizontal plane by expanding the germanium lattice in a vertical direction. At a thickness above the critical thickness, however, the germanium crystal is unable to take the strain of stretching to adapt to the silicon crystal; the germanium crystal will relax, and thus break, at some point. This breakage point is referred to as the critical thickness. For a thin layer of germanium matched to a silicon crystal, that critical thickness is approximately 14 Å. This critical thickness corresponds to approximately 3 to 4 atomic layers of germanium atoms in the crystal lattice. Thus it is preferred that the germanium crystal lattice have 3 or less atomic layers of germanium atoms.

It is preferred that the germanium layer grown on the substrate is pseudomorphically formed on the substrate, which means that the germanium is epitaxially lattice matched up to the critical thickness for germanium and the substrate material. Further the preferred pseudomorphic growth forms a germanium layer without dislocations. Optionally, it is preferred that the substrate layer has less than a 4.2% lattice mismatch with germanium. The preferred substrate layers other than silicon, gallium arsenide, indium phosphide, and alloys thereof, have lattice spacing that more closely match germanium than does silicon itself. Thus, the growth of germanium layers on these materials creates less stress in the germanium layer. Gallium arsenide, indium phosphide, and their alloys have a lattice mismatch with respect to germanium that is less than 4.2%.

A germanium layer can be grown on silicon to a thickness greater than the critical thickness. This is accomplished by including small amounts of carbon in the germanium. Carbon atoms in a germanium lattice allow the germanium crystal to relax without fracturing. Thus, when the germanium crystal is matched to a silicon lattice, and is grown beyond the critical thickness, stresses in the germanium crystal are resolved at the carbon localities. Generally a 1% concentration of carbon in germanium will relax the germanium crystal by approximately 10%. In one alternative embodiment, a germanium layer includes up to 5% carbon by weight. This is preferred where the germanium layer is desired to be greater than the critical thickness.

Figure 4:
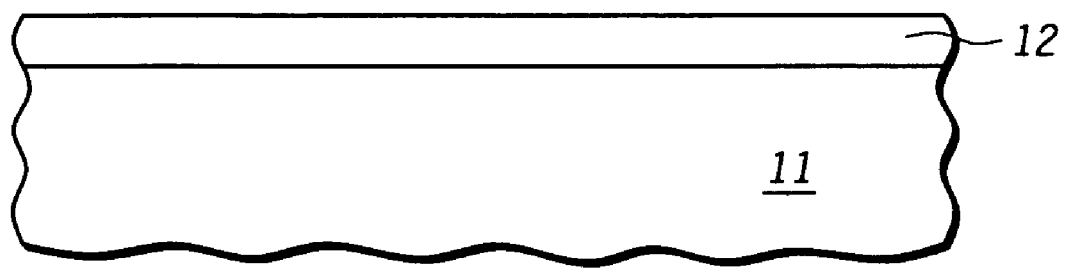
FIG. 4 is a perspective view of a germanium layer grown on a silicon layer in a 2-dimensional structure.
Figure 5:
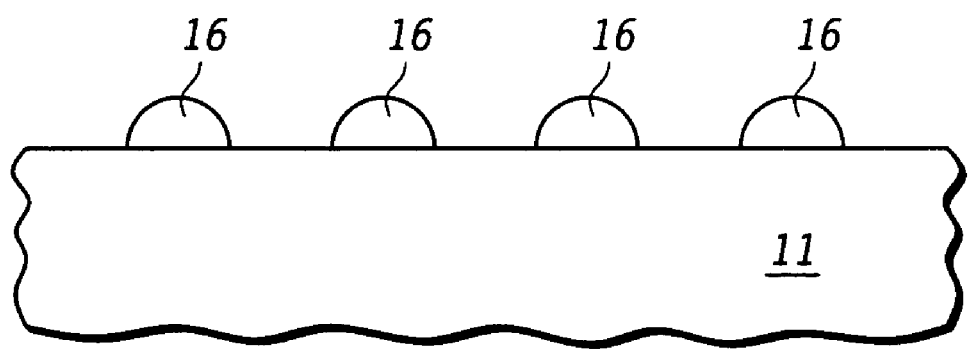
FIG. 5 is a perspective view of germanium materials grown on a silicon layer in a 3-dimensional structure.

It is preferred that growth of the germanium interfacial layer take place in the Stranski-Krastanov growth mode. Germanium grown on silicon can develop in a 2-dimension mode (Stranski-Krastanov) or a 3-dimensional mode (Volmer-Weber). Referring now to the figures, FIG. 4A illustrates the 2-dimensional growth of a germanium layer 12 on a silicon layer 11, and FIG. 4B illustrates the 3-dimensional growth of germanium "islands" 16 on a silicon substrate 11. 2-dimensional growth is characterized by the development of layers of germanium; the layers may be atomic layers. In the 2-dimensional growth mode, a first atomic layer of germanium is deposited on the silicon surface. That is followed by the deposition of a second atomic layer of germanium on the first layer. In contrast, 3-dimensional growth is characterized by the deposition of germanium material in clusters or "islands" where each island of germanium may itself consist of many atomic layers of germanium. Further, in 3-dimensional growth mode, the germanium islands may not be in contact with one another so that patches of the silicon surface are still exposed. As a layer of pure germanium growing in 2-dimensional mode passes the critical thickness, the germanium growth may convert to 3-dimensional growth mode as the germanium lattice relaxes. Thus the germanium layer should be kept at or below the critical thickness for pure germanium on silicon, approximately 14 Å. It is preferred that growth of the germanium layer does not transform from 2-dimensional growth to 3-dimensional growth.

Germanium is selected as a preferred material for the interfacial layer in part for the reason that the deposition of germanium on silicon does not produce significant levels of oxides that would otherwise form a silicon dioxide interfacial layer. Germanium does not readily form a chemically stable oxide structure. Oxides are thus minimized when pure germanium is deposited onto silicon in an oxygen-scarce atmosphere. The oxygen with which silicon may react is minimized. Thus, that difficulty of prior art methods is avoided. It will be further appreciated by those skilled in the art that good fabrication measures should be followed so as to minimize the presence of oxides. This may include, for example, operating in a vacuum or under an inert atmosphere so as to avoid the presence of oxygen. The use of high purity materials will also minimize the presence of oxides.

The germanium layer 12, having been deposited, it may be further treated to reduce any presence of any oxides. The treatment involves a cleaning step such as a treatment with a solution of hydrofluoric acid, or other cleaning agents. At this point the exposed surface of the germanium layer is ready for the deposition of high k materials in the dielectric layer.

The dielectric layer is deposited on the exposed surface of the germanium layer. In a preferred embodiment, the dielectric layer is less than 100 Å in thickness. Known methods of depositing high k materials on germanium may be followed.

As used herein the term "high k" or "high k dielectric material" means a dielectric material having a k value of about 10 or more. Such high k dielectric materials include, for example, hafnium oxides, zirconium oxides, lanthanum oxides, titanium oxides, aluminum oxides and others. In general high k dielectric materials encompass those materials that are binary, ternary and higher oxides and any ferroelectric materials having a k value of about 20 or more. Further the high k dielectric materials include composite materials such as hafnium silicate, other silicates, hafnium silicon oxynitride, germanium oxynitride, and other oxynitrides.

When a material is referred to by a specific chemical name or formula, the material may include non-stoichiometric variations of the stoichiometrically exact formula identified by the chemical name. Thus, for example, hafnium oxide may include both the stoichiometrically exact composition of formula $HfO_2$ as well as $Hf_xO_y$ in which either of x or y vary by some amount from 1 and 2 respectively.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method for forming a semiconductor structure comprising the steps of:
   providing a silicon substrate with an exposed surface;
   inhibiting formation of one or more oxides on the exposed surface of the silicon substrate, wherein inhibiting comprises the steps of:
      cleaning the exposed surface of the silicon substrate to reduce the presence of oxides;
      depositing a layer of substantially pure germanium directly on the cleaned, exposed surface of the silicon substrate such that the germanium layer is less than approximately 14 Å in thickness and is epitaxially matched to the silicon substrate, wherein the deposited substantially pure germanium layer has an exposed surface; and
      cleaning the exposed surface of the substantially pure germanium layer to reduce the presence of oxides; and
   forming a dielectric layer of high k material directly on the cleaned, exposed surface of the substantially pure germanium layer.

2. The method according to claim 1 wherein the step of providing the substrate layer further comprises providing a silicon layer with an exposed surface of single crystal silicon.

3. The method according to claim 1 wherein the step of providing the substrate layer further comprises providing a gallium arsenide layer with an exposed surface of single crystal gallium arsenide or its alloy compounds.

4. The method according to claim 1 wherein the step of providing the substrate layer further comprises providing an indium phosphide layer with an exposed surface of single crystal indium phosphide or its alloy compounds.

5. The method according to claim 1 wherein the step of depositing the layer of substantially pure germanium comprises depositing a layer of substantially pure germanium through a chemical vapor deposition (CVD) process.

6. The method according to claim 1 wherein the step of depositing the layer of substantially pure germanium comprises depositing a layer of substantially pure germanium through a molecular beam epitaxy (MBE) process.

7. The method according to claim 1 wherein the step of depositing the layer of substantially pure germanium comprises depositing a layer of substantially pure germanium through an atomic layer deposition (ALD) process.

8. The method according to claim 1 wherein the step of depositing the substantially pure germanium layer further comprises growing a substantially pure germanium layer in the 2-dimensional growth mode.

9. The method according to claim 1 wherein the step of depositing the substantially pure germanium layer further comprises depositing a substantially pure germanium layer having three or less atomic layers in the germanium crystal lattice.

10. The method according to claim 1 wherein the step of depositing one of the dielectric layer and the stack of dielectric layers of high k material further comprises utilizing a dielectric material selected from a group consisting of hafnium oxides, zirconium oxides, titanium oxides, aluminum oxides, silicates, and hafnium nitrides.

11. A method for forming a semiconductor structure comprising the steps of:
    providing a high purity single crystal silicon substrate layer with an exposed surface;
    inhibiting formation of one or more oxides on the exposed surface of the substrate, wherein inhibiting comprises the steps of:
       cleaning the exposed surface of the substrate layer to reduce the presence of oxides;
       depositing a layer of high purity germanium on the cleaned, exposed surface of the substrate layer wherein the germanium layer is epitaxially matched to the substrate layer and includes up to 5% carbon and such that the germanium layer is less than a critical thickness, and wherein the deposited germanium layer has an exposed surface; and
       cleaning the exposed surface of the germanium layer to reduce the presence of oxides; and
    depositing a dielectric layer of high k material on the cleaned, exposed surface of the germanium layer.

12. The method according to claim 11 wherein the step of depositing the layer of high purity germanium further comprises depositing a high purity layer of germanium such that the germanium layer is less than approximately 14 Å in thickness.

13. The method according to claim 11 wherein the step of depositing the dielectric layer further comprises depositing a dielectric layer that is less than approximately 100 Å in thickness.

14. The method according to claim 11 wherein the step of depositing the dielectric layer of high k material further comprises a dielectric material selected from a group consisting of hafnium oxides, zirconium oxides, titanium oxides, aluminum oxides, silicates, hafnium nitrides, germanium oxynitrides, and lanthanum oxides.

15. The method according to claim 11 wherein the step of depositing the dielectric layer further comprises depositing a dielectric layer that is between approximately 60 to approximately 80 Å in thickness.

16. The method according to claim 11 wherein the step of depositing the layer of germanium comprises depositing a layer of germanium through a chemical vapor deposition (CVD) deposition process.

17. The method according to claim 11 wherein the step of depositing the layer of germanium comprises depositing a layer of germanium through a molecular beam epitaxy (MBE) process.

18. The method according to claim 11 wherein the step of depositing the layer of germanium comprises depositing a layer of germanium through an atomic layer deposition (ALD) process.

* * * * *